United States Patent Office 3,262,780

Patented July 26, 1966

3,262,780

PREPARATION OF PHOTOPOLYMERIZED PRINTING ELEMENTS

Glen A. Thommes, Red Bank, N.J., assignor to E. I. du Pont de Nemours and Company, Wilmington, Del., a corporation of Delaware No Drawing. Filed Apr. 27, 1962, Ser. No. 190,779
9 Claims. (Cl. 96—48)

This invention relates to a process for the preparation of improved photopolymerized printing elements.

Photopolymerizable compositions and elements, as described in assignee's U.S. patents, Plambeck U.S. 2,760,-863 and 2,791,504, Barney U.S. 2,893,868, Martin U.S. 2,902,365, Martin et al. U.S. 2,927,022 and Smith U.S. 3,012,952, are useful in the preparation of printing reliefs. These compositions, in addition to other photopolymerizable compositions to be hereinafter described, contain inter alia, addition polymerizable ethylenically unsaturated compounds, e.g., vinylidene and vinyl monomers, preferably of the acrylic or alkacrylic ester type, an organic polymer binder or filler material and an addition polymerization initiator activatable by actinic radiation. The photopolymerizable element is exposed, imagewise, e.g., through a suitable light stencil, or a photographic process transparency, to actinic radiation which causes the ethylenically unsaturated compound to photopolymerize and become substantially insoluble in the exposed areas. Following exposure, the element is treated to remove the composition in the unexposed areas but not in the exposed areas. The resulting printing relief is useful directly for purposes other than printing. Thus, the printing reliefs can be used for the production of stereotype mats and molds for making duplicate plates. Stereotype mats are prepared by pressing soft paper having a high moisture content (10 to 25%) against the printing relief with pressures of about 3000 to 7000 pounds per square inch. A female matrix is formed in the paper which serves as a mold into which molten type metal is poured. After the metal has hardened, the paper mat is stripped off to give a duplicate of the original plate. Molds for duplicate plates are usually made by pressing the relief plate into plastic materials with considerable force to make duplicate plates.

When the photopolymerizable elements referred to above contain polymeric binders that contain free acid groups, the latter are converted into soluble salts when treated with aqueous alkaline wash-out solutions. The cation in the washing solution forms a salt with the acid groups. In the exposed polymerized areas, the washing solution also has some ion exchange effect at or near the surface of the photopolymerized element, since the binder in these areas is at least partially converted to its corresponding salt. As a result of this surface modification, the relief image has increased sensitivity to water; and it does not have sufficient hardness to withstand compression deformation caused by the pressures used when making stereotype mats and molds. This problem is intensified by the high moisture content of the paper matting material.

When photopolymerized printing plates are used for printing, they are subjected to inks containing organic liquids which have some solvent action on the macromolecular polymer binder and also on an anchor or adhesive layer holding the photopolymerizable layer to the support. After the printing operation, the printing plate is washed with solvent solutions. This washing action is detrimental to the durability of the plate in that it can weaken the adhesive bond with consequent loss of printing characters of the relief image.

An object of this invention is to provide a simple and economical process for preparing improved photopolymerized printing reliefs which overcome the above enumerated disadvantages.

A further object is to provide photopolymerized relief elements which have superior surface characteristics for use in preparing stereotype mats. A still further object is to provide an economical process for treating photopolymerized relief printing plates to provide improved resistance to printing inks and type cleaning solvents.

The foregoing objects are attained in accordance with this invention by a process which comprises treating the surface of a printing relief comprising:

(a) A solid addition polymer of an ethylenically unsaturated monomer containing at least one terminal ethylenic group, and (b) A solid organic polymer binding agent of molecular weight above 10,000 and containing extralinear recurring solubilizing groups selected from the class consisting of free carboxylic acid and sulfonic acid groups and their corresponding alkali metal, ammonium and amine salts with an aqueous solution containing at least one salt of a polyvalent metal for a period of at least 15 seconds. In general, the aqueous treating solutions will have a salt concentration of about 3 to 10% or more by weight of solution. When the treatment is carried out at room temperature, a treatment time of 30 seconds to 20 minutes will generally suffice. At higher temperatures, e.g., 70° C. to 100° C. the time of treatment can vary from 15 seconds to 10 minutes.

Preferably the photopolymerizable composition useful to make the photopolymerized reliefs used in accordance with the invention comprises (a) An addition polymerizable, non-gaseous ethylenically unsaturated compound containing at least one terminal ethylenic group ($CH_2=C<$) having a boiling point above 100° C. at normal atmospheric pressure and being capable of forming a high polymer by free-radical initiated chain propagating addition polymerization, and (b) A preformed, compatible macromolecular polymeric binding agent having free carboxylic acid or sulfonic acid groups capable of forming salt groups in alkaline solution, e.g., cellulose acetate succinate, cellulose acetate glutarate and corresponding esters with phthalic, tetrahydraphthalic, endo cis-bicyclo (2,2,1)-5-heptene-2,3-dicarboxylic acid; polyvinyl alcohol acetate sodium o-sulfobenzaldehyde acetal, polyvinyl acetal/hydrogen dicarboxylates, etc. Components (a) and (b) are present in amounts of 10 to 60 and 40 to 90 parts by weight, respectively.

Particularly preferred compositions, in addition, contain (c) a free-radical generating addition polymerization initiator activatable by actinic radiation in an amount from 0.0001 to 10 parts by weight of components (a) and (b), and, optionally, (d) a thermal addition polymerization inhibitor in an amount from 0.001 to 6 parts by weight of components (a) and (b).

There are known many solid organic polymer binding agents having an average molecular weight above 10,000 and containing recurring solubilizing groups useful as constituent (b). Among the useful ones are those disclosed in Martin U.S. Patent 2,902,365, September 1, 1959, which are polyvinyl alcohol derivatives having a molecular weight greater than 10,000 taken from the group consisting of polyvinyl esters of mono-substituted acids, polyvinyl ethers of monosubstituted alcohols, polyvinyl acetals of monosubstituted aldehydes and such derivatives containing more than one type of the ester, ether and acetal groups, said derivative being further characterized in that said mono-substituted acids, ethers and aldehydes contain not more than seven carbon atoms, and the substituent of said mono-substituted compounds is taken from the class consisting of free oxyacid groups and alkali metal, ammonium and amine salts thereof, and said derivatives are soluble to the extent of at least 10% by weight in 2% aqueous ammonia solution, and in free acid form have a neutralization equivalent from about 115 to about 2500.

Other useful binding agents are disclosed in Munger U.S. Patent 2,923,673—February 2, 1960. They are cellulose mixed esters of fatty acids of 2–4 carbon atoms and of dicarboxylic acid anhydrides. Still other useful binding agents containing solubilizing groups are described in Martin and Barney U.S. Patent 2,927,022—March 1, 1960. They are essentially linear cellulose derivatives of high molecular weight having the cellulose structure and containing at least 50 combined glucose units in the polymer chain of atoms, taken from the group consisting of cellulose phosphates, cellulose sulfates, and cellulose ethers and cellulose carboxylic acid esters containing a free acid group taken from the class consisting of carboxylic and sulfonic acid groups, and the alkali metal and ammonium salts of said cellulose compounds, said derivatives having a total degree of substitution in the range 2.0 to 3.0 per glucose unit, the total number of hydroxyl groups in said derivative, including any acid hydroxyl groups, being in the range 0.5 to 2.5 per glucose unit, there being sufficient lateral such groups so that said derivative when in acid form has a neutral equivalent in the range 200 to 700, said cellulose derivative being soluble to the extent of at least 10% by weight.

The image-yielding photopolymerizable elements useful to make the printing reliefs treated in accordance with this invention comprise a support, e.g., a metal or polymeric sheet bearing an adhesive anchoring layer and at least one photopolymerizable stratum of the above described compositions. The photopolymerizable stratum may have a thickness of up to 250 mils, e.g., about 3 to 250 mils. The elements are exposed imagewise to actinic radiation as described in the aforementioned patents; subsequently the unexposed aeas are removed and the image-bearing elements may be treated with acid as described in assignee's Thommes application Serial No. 170,511 filed February 1, 1962, followed, if desired, by post-exposure. However, the acid treatment is not necessary.

The ethylenically unsaturated compound which is capable of polymerizing or forming the high polymer [constituent (a)] in a short period of time by photoinitiated, chain-propagating, addition polymerization can be any of the monomeric compounds disclosed in Plambeck U.S. Patent 2,760,863. Preferably the compounds are nongaseous at 20° C. and atmospheric pressure, have 1 to 4 or more terminal ethylenic groups, preferably two or more, and a plasticizing action on the thermoplastic polymer in addition to its other properties disclosed above.

Suitable addition polymerizable ethylenically unsaturated compounds which can be used in the photopolymerizable compositions and elements include unsaturated esters of alcohols, preferably polyols, and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tri- and tetramethacrylate, pentaerythritol tetraacrylate, pentaerythritol triacrylate, dipentaerythritol hexacrylate, tripentaerythritol octaacrylate, mannitol hexacrylate, sorbitol hexacrylate, inositol hexacrylate and the corresponding methacrylates, 1,3-propanediol diacrylate, 1,5-pentanediol dimethacrylate, the bis-acrylates and methacrylates of polyethylene glycols of molecular weight 200–1500, and the like; unsaturated amides, particularly those of the alphamethylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis (gamma-methacrylamidopropoxy)ethane, beta-methacrylamidoethyl methacrylate, N-beta-hydroxy - ethyl - beta-(methacrylamido)ethyl acrylate and N,N-bis (beta-methacrylyloxyethyl)acrylamide; vinyl esters such as divinyl succinate, divinyladipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional monomers can be used. The amount of monomer added varies with the particular thermoplastic polymer used.

Present in the preferred photopolymerizable compositions are photoinitiators (3) preferably those activatable by actinic light and thermally inactive at and below 185° C. which include the substituted or unsubstituted polynuclear quinones which are compounds having two intracyclic carbonyl groups attached to intracyclic carbon atoms in a conjugated carbocyclic ring system. Suitable specific initiators include 9,10-anthraquinone, 1-chloroanthraquinone, 3-chloroanthraquinone, 2-methylanthraquinone and the other anthraquinones disclosed in Notley U.S. Patent 2,951,758, September 6, 1960.

Thermal polymerization inhibitors (d) are useful in the unpolymerized compositions, including p-methoxyphenol, hydroquinone, and alkyl and aryl-substituted hydroquinones, quinone, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene, in addition to p-toluquinone and chloroanil.

In making the original photopolymerizable elements, at least one stratum and preferably two of the photopolymerizable composition is coated on a base support. Suitable bases or supports include those disclosed in U.S. Patent 2,760,863, metals, wood, cellulose, esters, e.g., cellulose acetate, cellulose propionate, cellulose butyrate, etc., and other plastic compositions such as polyamides, polyesters, e.g., polyethylene terephthalate, etc. The support may have in or on its surface and beneath the outer photopolymerizable stratum, an antihalation layer as disclosed in said patent or other substrata needed to facilitate anchorage to the base, e.g., the adhesive compositions disclosed in the Burg application noted below, now U.S. Patent 3,036,913—May 29, 1962.

As previously described, the invention is also useful with photopolymerizable elements containing more than one stratum of photopolymerizable composition as disclosed in Plambeck U.S. Patent 2,964,401 and Crawford U.S. Patent 2,993,789; and assignee's Notley application Serial No. 788,501, filed Jan. 23, 1959, now U.S. Patent No. 3,157,505.

In treating the surface of the photopolymerized relief, there can be used any water-soluble multivalent cation capable of salt formation or complex formation with the acid group of the binder. Multivalent cation salts which have been found useful in the invention are calcium, barium, lead, zinc, cobalt, copper and uranium chlorides, bromides, nitrates, acetates, etc. Tetramine copper (II) acetate has been found to be particularly efficacious in the process of the invention. The salts should be soluble in water to the extent of at least 10 grams per liter of water. In view of the fact that ion exchange and complexation are pH dependent processes, limited pH control can, of course, be accomplished by the proper selection of a hydrolyzable anion.

In a preferred aspect of this invention, polymer relief plates of the type described above are immersed at room temperature for from 30 seconds to 30 minutes and preferably from 1 to 10 minutes in an aqueous solution of a multivalent cation salt and dried.

The resulting photopolymerized composition of the so treated plates can be used to make a large number of stereotype mats without evidence of abrasion and rounding of relief characters due to compression. The so treated plates can also be used on standard printing presses using the usual solvent based inks and washed with type wash solutions which generally contain a large quantity of acetone or similar organic solvent.

The above treatment may also be combined with other treatments such as that described in assignee's copending Thommes application U.S. Serial No. 170,511 filed Feb. 1, 1962, which is concerned with treating the alkaline washed relief plate with an acid to remove the monovalent alkali metal cation. This process has many advantages when the plate is to be used only for printing; because, as indicated above, the monovalent alkali metal salt form of the binder causes the plate to be very water sensitive and exhibit increased swelling in water, especially in the small highlight dot areas of halftones, and have excess cupping of small dots. Cupping is the difference in height of the dot from the edge to the center, i.e., a concave printing surface. The above referred to acid treatment removes the above objections and provides a relief printing plate having less moisture sensitivity and better character structure for printing. However, photopolymerized relief plates treated as described in the above application frequently have inadequate hardness and durability for use in making stereotype mats and molds. They also have low resistance to organic solvents.

The instant invention readily overcomes the above disadvantages without causing the plate to be moisture sensitive as in the case where the carboxyl group is left in the form of the monovalent alkali metal salt. This invention also further decreases the permeability of the lower thermally polymerized strata or barrier layer described in assignee's Burg Ser. No. 750,868, filed July 25, 1958 (U.S.P. 3,036,913) and thus prevents solvent action on the adhesive anchoring layer thus preserving the fidelity of the relief printing plate.

The invention will be further illustrated by, but is not limited to, the following examples:

*Example I*

A photopolymerizable composition comprising 30 parts of triethylene glycol diacrylate, 67 parts of cellulose acetate succinate with a degree of acetyl substitution of 1.9 and of succinyl substitution of 0.7, 0.13 part of 2-ethylanthraquinone and 0.13 part of p-methoxyphenol was prepared according to Smith U.S. Patent 2,012,952. This composition was pressed into a sheet of about 20-mil thickness and bonded to adhesive covered steel plates, about 10-mil thick, according to assignee's Burg application Ser. No. 750,868, filed July 25, 1958 (U.S.P. 3,036,913), to form two photopolymerizable elements. The elements formed were then exposed through a combination line and halftone photographic negative to the radiation from a 140 ampere carbon arc lamp for 5 minutes at a temperature of about 30° C. at a distance of 30 inches from said lamp. The exposed elements were washed out to yield relief plates by a 10 minute exposure to a spray of 0.04 molar solution of sodium hydroxide. After drying, the elements were given a post-exposure to the above source of radiation at a distance of 21 inches from the lamp at a temperature of about 90° C.

One of the elements was then immersed for 7 minutes at room temperature (about 25° C.) in a 1 molar aqueous solution of tetrammine copper (II) acetate. The treated element or plate was dried and the two plates were then used to prepare stereotype mats.

These mats were produced in the following manner. The plates were pressed into soft paper mat material which contained 10–25% moisture under a uniform pressure of 4000 pounds per square inch to yield a female matrix in the paper mat material of the image contained on the relief plate. The paper matrixes or stereotype mats were then used to produce duplicate metal plates by casting type metal into said matrixes. All of the details of the process for casting type metal is well known in the printing art. After 10 to 15 mats were produced, the duplicate plates made from the mats were examined for damage to printing characters such as the halftone dots. The plate which had not been treated with the copper salt solution showed considerable abrasion and rounding of printing characters due to compression. The photopolymerized relief plate which had been treated did not show any significant damage due to rounding of characters by compression and abrasion damage was completely absent. It was found that from 50 to 100 mats could be made from the plates treated with the copper salt solution before any compression damage became evident. There was no abrasion damage.

*Example II*

A photopolymerizable element made as described in Example I and without an image forming exposure was submitted to the alkali-metal solution wash-out process. This removed all of the photopolymerizable material except a thin substratum which had been polymerized by the thermal initiator. One half of the plate was then treated by immersing for 1 minute in a 5% aqueous solution of calcium acetate. The entire plate was then dried in a desiccator at 0% relative humidity overnight to bring both halves of the plate to an equivalent moisture content. The plate was then immersed in acetone for a period of one hour with frequent examinations to observe any penetration of acetone through the barrier layer and consequent softening and failure of the adhesive layer. The half of the plate which had not been treated with the calcium acetate solution began to show rapid softening almost immediately whereas the treated portion of the plate did not show any substantial deterioration after one hour's immersion in the acetone bath except at the edges. This illustrates quite clearly that the process of the invention results in decreased permeability of the barrier layer to solvents and thus prevents any deterioration of the adhesive layer thus increasing the durability of the printing relief element.

*Example III*

Four photopolymerizable elements or plates were made in the manner described in Example I. The plates were subjected to the alkaline washout treatment without an image exposure to remove the unpolymerized composition down to the barrier layer as described in Example II. Each of three of the plates were immersed for about 2 minutes in 5% aqueous solutions of calcium acetate, barium acetate and lead acetate respectively. The three treated plates and the fourth untreated control were placed in an atmosphere of 88% relative humidity until the moisture content of the plates had reached equilibrium. The plates were then immersed in acetone for periods of time sufficient to allow the barrier layer to be stripped from the plate indicating failure of the adhesive. The results are shown in the following table.

| | Control | Barium Acetate | Lead Acetate | Calcium Acetate |
|---|---|---|---|---|
| Stripping Time, min | 10 | 32 | 32 | 13 |

It will be seen that all of the multivalent cation salts decreased the permeability of the barrier layer to acetone even at moisture levels in the barrier layer which favor solvent permeability, and that the barium and lead salts were superior to the calcium salt.

*Example IV*

Two photopolymerizable plates were made, exposed and processed with an alkaline wash-out solution as described in Example I. One of the plates was then immersed in a 5% solution of barium acetate for 3 minutes. After drying in a desiccator, the two plates were immersed in acetone for two hours. At the end of this time, the printing characters in the plates were examined for hardness and deterioration. In the untreated plate, the adhesive layer showed definite failure and some printing characters were lost. In the treated plate, there was no evidence of adhesive deterioration or lack of hardness.

Other multivalent cation salts which may be used are cobalt and uranium nitrate, chloride or acetate although any multivalent cation which will crosslink the binders through the carboxylate group may be used.

The process of this invention can be applied to all photopolymerized printing plates made in accordance with teachings of the patents and patent applications referred to above. The printing reliefs treated in accordance with the process of this invention can be used in all kinds of printing including lithography but are most applicable to those classes of printing wherein a distinct difference of height between printing and non-printing surfaces is required. These classes include those wherein the ink, e.g., glycol-based ink, is carried by the raised portion of the relief such as in dry-offset printing and ordinary letterpress printing, the latter requiring greater height differences between printing and non-printing areas, and those wherein ink is carried by the recessed portions of the relief such as intaglio printing, e.g., line and inverted halftone. The so-treated plates are also useful for multicolor printing. The elements are also useful in a variety of decorative and manufacturing applications where extremely hard polymerized surfaces are required.

An advantage of photopolymerized printing elements which have been treated with multivalent cation salt solutions in accordance with this invention is that they are more resistant to organic solvents and more resistant to moisture pickup. The so-treated plates also show a superior resistance to abrasion. The superior characteristics of moisture resistance and abrasion resistance offer great advantages in making stereotype mats which have a high moisture content. Under the pressures necessary for making such mats, the paper fiber is very abrasive. In contact with such mats, the untreated elements soften rapidly because the monovalent sodium salt of cellulose acetate succinate is water sensitive. The treated surface, on the other hand, having the sodium cations replaced by a multivalent cation like copper, lead, barium and calcium which acts as a cross-linking agent for the binder molecules overcomes the above moisture sensitivity.

The treated surfaces are also much less permeable to organic solvents; particularly glycol based inks and type wash solvent which are used extensively in package printing. This has considerable advantage in improving the adhesion of the photopolymerized layers to the base support. Still further advantages will be apparent to those skilled in the art from the foregoing description.

I claim:

1. A process for improving the surface characteristics of a polymeric relief which comprises treating the surface of a printing relief comprising:
   (a) a solid addition polymer of an ethylenically unsaturated monomer containing at least one terminal ethylenic group, and
   (b) a preformed solid organic polymer binding agent having a molecular weight above 10,000 and containing recurring extralinear solubilizing groups selected from the class consisting of free carboxylic acid and sulfonic acid groups and their corresponding alkali metal, ammonium and amine salts, with an aqueous solution containing at least one water-soluble salt of a polyvalent metal soluble to the extent of at least 10 grams per liter of water and capable of salt formation or complex formation with the solubilizing groups of said polymer binding agent and for a period of at least 15 seconds.

2. A process according to claim 1 wherein said unsaturated monomer contains a plurality of terminal ethylenic groups, has a boiling point above 100° C. at normal atmospheric pressure and is capable of forming a high polymer by free-radical initiated chain propagated addition polymerization.

3. A process according to claim 1 wherein said salt is tetramine copper (II) acetate.

4. A process according to claim 1 wherein said salt is calcium acetate.

5. A process according to claim 1 wherein said salt is barium acetate.

6. A process according to claim 1 wherein said salt is lead acetate.

7. A process according to claim 1 wherein the relief is a printing relief and the binding agent is a cellulose ester.

8. A process according to claim 1 wherein said printing relief embodies halftone image areas.

9. A process according to claim 1 wherein said printing relief embodies both line and halftone image areas.

References Cited by the Examiner

UNITED STATES PATENTS

| | | | |
|---|---|---|---|
| 2,416,060 | 2/1947 | McAlevy et al. | 260—79.7 |
| 2,767,457 | 10/1956 | Epstein | 96—35 |
| 2,902,365 | 9/1959 | Martin | 96—115 X |
| 2,923,673 | 2/1960 | Munger | 96—115 X |
| 2,927,022 | 3/1960 | Martin et al. | 96—115 X |
| 3,025,161 | 3/1962 | Rychlewski | 96—35 |

NORMAN G. TORCHIN, *Primary Examiner.*

R. L. STONE, A. D. RICCI, *Assistant Examiners.*